(12) United States Patent
Lee et al.

(10) Patent No.: US 10,276,787 B2
(45) Date of Patent: Apr. 30, 2019

(54) INTEGRATED ANISOTROPIC MAGNETORESISTIVE DEVICE

(71) Applicant: Texas Instruments Incorporated, Dallas, TX (US)

(72) Inventors: Dok Won Lee, Mountain View, CA (US); William David French, San Jose, CA (US); Ricky Alan Jackson, Richardson, TX (US); Fuchao Wang, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/041,575

(22) Filed: Feb. 11, 2016

(65) Prior Publication Data

US 2017/0236998 A1    Aug. 17, 2017

(51) Int. Cl.
*H01L 43/12*    (2006.01)
*H01L 43/08*    (2006.01)
*H01L 27/22*    (2006.01)

(52) U.S. Cl.
CPC .............. *H01L 43/12* (2013.01); *H01L 27/22* (2013.01); *H01L 43/08* (2013.01)

(58) Field of Classification Search
CPC ......... H01L 43/02; H01L 43/08; H01L 43/10; H01L 43/12; G01R 33/096
See application file for complete search history.

(56) References Cited

U.S. PATENT DOCUMENTS

| | | |
|---|---|---|
| 5,667,879 A | 9/1997 | Haji-Sheikh |
| 6,433,545 B1 | 8/2002 | Kunze et al. |
| 6,633,462 B2 | 10/2003 | Adelerhof |
| 6,831,458 B2 | 12/2004 | Haji-Sheikh et al. |
| 7,423,329 B2 | 9/2008 | Witcraft et al. |
| 8,885,302 B1 * | 11/2014 | David ................ G01R 33/0052 360/327 |
| 9,030,199 B2 | 5/2015 | Liou et al. |
| 9,134,385 B2 | 9/2015 | Chilcote et al. |
| 9,377,327 B2 | 6/2016 | Kubik |

(Continued)

FOREIGN PATENT DOCUMENTS

DE         4438715 C1    10/1994

OTHER PUBLICATIONS

Dok Won Lee, et al., "Anisotropic Magneto-Resistive (AMR) Angle Sensor", U.S. Appl. No. 15/656,749, filed Jul. 21, 2017.
PCT International Search Report dated Oct. 25, 2018.

*Primary Examiner* — David C Spalla
(74) *Attorney, Agent, or Firm* — Rose Alyssa Keagy; Charles A. Brill; Frank D. Cimino

(57) ABSTRACT

An integrated device includes a substrate having a semiconductor surface layer including functional circuitry, a lower metal stack on the semiconductor surface layer, an interlevel dielectric (ILD) layer on the lower metal stack, a top metal layer providing AMR contact pads and bond pads coupled to the AMR contact pads in the ILD layer. An AMR device is above the lower metal stack lateral to the functional circuitry including a patterned AMR stack including a seed layer, an AMR material layer, and a capping layer, wherein the seed layer is coupled to the AMR contact pads by a coupling structure. A protective overcoat (PO layer) is over the AMR stack. There are openings in the PO layer exposing the bond pads.

16 Claims, 2 Drawing Sheets

(56) References Cited

U.S. PATENT DOCUMENTS

| | | | |
|---|---|---|---|
| 9,620,707 B2* | 4/2017 | Zimmer | H01L 43/08 |
| 2004/0087037 A1* | 5/2004 | Berg | B82Y 10/00 |
| | | | 438/3 |
| 2005/0259365 A1* | 11/2005 | Singleton | G11B 5/39 |
| | | | 360/324.1 |
| 2005/0277292 A1* | 12/2005 | Peng | H01L 21/28562 |
| | | | 438/672 |
| 2013/0241543 A1 | 9/2013 | Stenson et al. | |
| 2014/0184381 A1 | 7/2014 | Hao et al. | |
| 2014/0210024 A1* | 7/2014 | Lin | H01L 43/12 |
| | | | 257/421 |
| 2015/0091559 A1 | 2/2015 | Erie et al. | |
| 2015/0194597 A1 | 7/2015 | Fermon | |
| 2015/0340594 A1* | 11/2015 | Liou | H01L 43/02 |
| | | | 257/48 |

\* cited by examiner

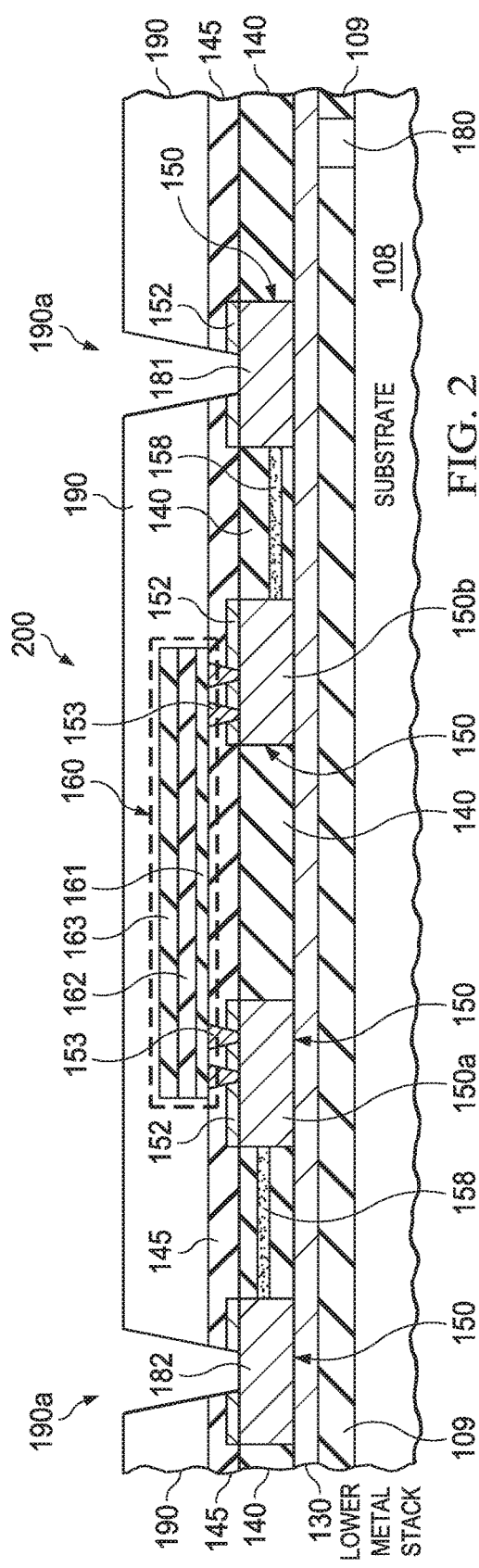
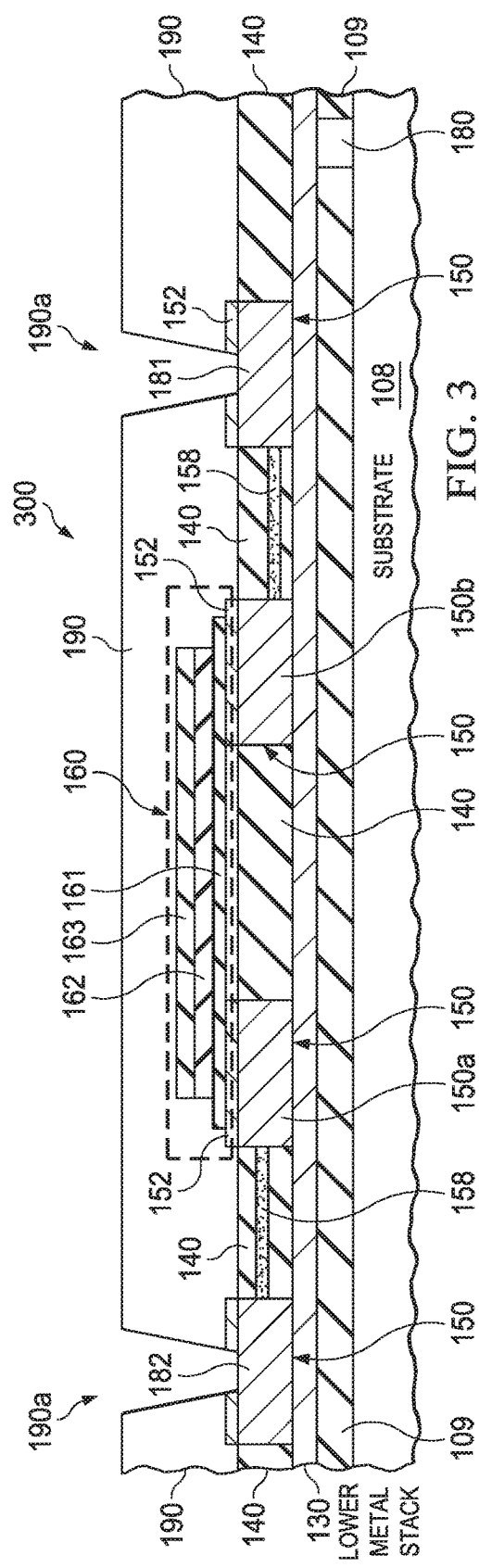

10,276,787 B2

INTEGRATED ANISOTROPIC MAGNETORESISTIVE DEVICE

FIELD

Disclosed embodiments relate to integrated anisotropic magnetoresistive devices.

BACKGROUND

Magnetoresistive devices change their electrical resistance in the presence of a magnetic field. Anisotropic Magneto Resistive (AMR) sensors include a material in which there is a dependence of its electrical resistance on the angle between the direction of electric current and the direction of magnetization observed. AMR sensors offer robust non-contact measurement of changes in the magnetic field as seen by the sensor, where the AMR sensor can detect the presence, the strength, and/or the direction of the magnetic field. The strength of the magnetic field may be represented by a magnitude and a polarity (positive or negative). The direction of the magnetic field may be also described by its angular position with respect to the AMR sensor.

In typical applications for AMR sensors, magnetoresistive materials such as nickel iron (NiFe) having top electrical connections are used to detect the component of a magnetic field that lies in the plane of the MR material. In some applications, the MR material is disposed in a serpentine array on the surface of a substrate such as silicon. The serpentine pattern of MR material can be electrically connected in a Wheatstone bridge arrangement (4 resistors) or a pair of Wheatstone bridges in order to sense changes in the resistance of the MR material in response to changes in the strength of a magnetic field component in the plane of the MR elements. In order to monitor the changes in the resistance of the MR material, associated components such as amplifiers are generally connected together to form an electrical circuit which provides an output signal that is representative of the strength of the magnetic field in the plane of the MR sensing elements.

SUMMARY

This Summary is provided to introduce a brief selection of disclosed concepts in a simplified form that are further described below in the Detailed Description including the drawings provided. This Summary is not intended to limit the claimed subject matter's scope.

Disclosed embodiments include integrated devices including an AMR device comprising a patterned AMR stack and functional circuitry formed on a substrate having a semiconductor surface layer with a lower metal stack on the semiconductor surface layer. An interlevel dielectric (ILD) layer is on the lower metal stack, then a top metal layer which provides Anisotropic Magneto Resistive (AMR) contact pads and bond pads coupled to the AMR contact pads.

The AMR device is above the lower metal stack lateral to the functional circuitry. The patterned AMR stack includes a seed layer, an AMR material layer, and a capping layer, wherein the seed layer is coupled to the AMR contact pads by a coupling structure. Disclosed integrated devices thus feature an electrical connection to the bottom of AMR stack which allows the use of a dielectric capping layer (e.g. AlN) that thus eliminates current shunting through the capping layer that occurs when using a conventional metal capping layer. A protective overcoat (PO layer) is over the AMR stack, and there are openings in the PO layer which expose the bond pads to allow wire bonding thereto.

BRIEF DESCRIPTION OF THE DRAWINGS

Reference will now be made to the accompanying drawings, which are not necessarily drawn to scale, wherein:

FIG. 2 is a cross-sectional view of an example integrated device including an AMR device having metal filled vias coupling the seed layer to the AMR contact pads, according to an example embodiment.

FIG. 3 is a cross-sectional view of another example integrated device including an AMR device having the seed layer directly on refractory metal pads on AMR contact pads, according to an example embodiment.

DETAILED DESCRIPTION

Figure 1:
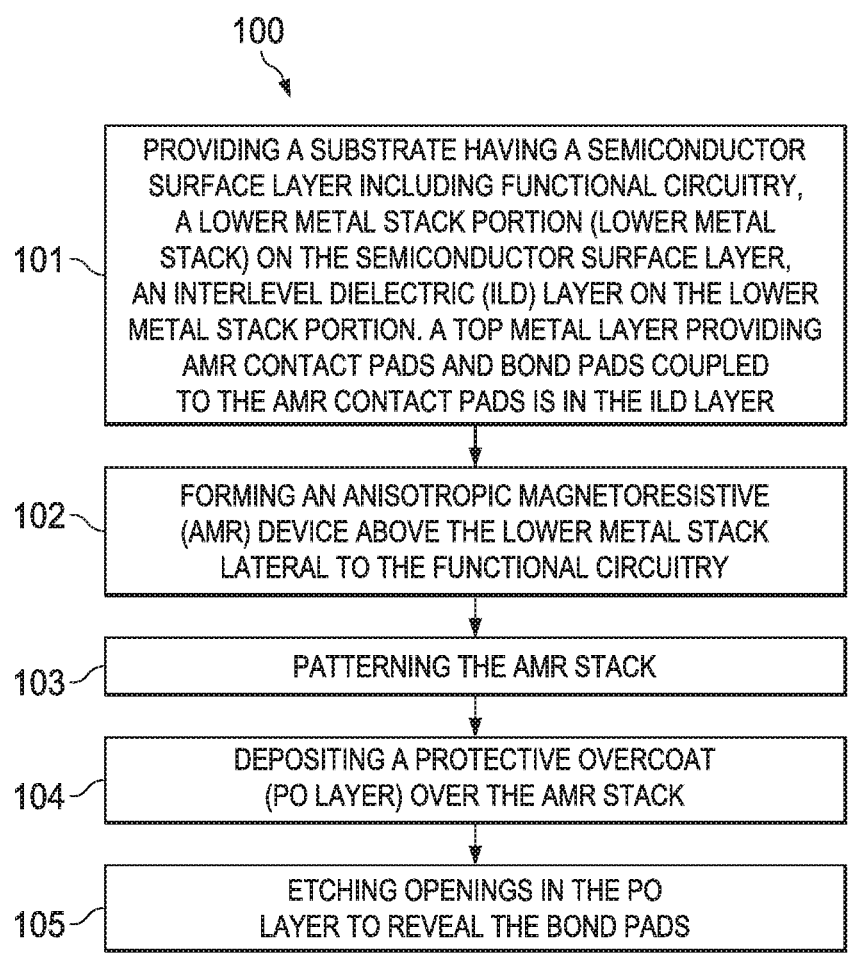
FIG. 1 is a flow chart that shows steps in an example method for forming an integrated device including an AMR device, according to an example embodiment.

Example embodiments are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

FIG. 1 is a flow chart that shows steps in an example method 100 for forming an integrated device including an AMR device, according to an example embodiment. Method 100 is a thin-film-resistor (TFR)-like process to form the AMR device so that there are only minimal changes to the existing semiconductor process flow utilized to form integrated circuits, which is generally a complementary metal-oxide-semiconductor (CMOS) process. Step 101 comprises providing a substrate 108 (for reference numbers shown for method 100 see FIG. 2 described below) having a semiconductor surface layer 109 including functional circuitry 180, a lower metal stack 130 on the semiconductor surface layer 109, and an ILD layer 140 on the lower metal stack 130. The substrate 108 and/or semiconductor surface 109 can comprise silicon, silicon-germanium, or other semiconductor material. One particular arrangement is a silicon/germanium (SiGe) semiconductor surface 109 on a silicon substrate 108.

A top metal layer 150 in the ILD layer 140 provides AMR contact pads 150a and 150b and bond pads 181, 182 which are coupled to the AMR contact pads 150a and 150b, shown in FIG. 2 coupled together by top metal layer coupling traces 158. Although shown in FIG. 2 differently from the top metal layer 150, the top metal layer coupling traces 158 comprise the top metal layer 150 and are thus the same thickness as the bond pads 181, 182 and AMR contact pads 150a and 150b. The top metal layer coupling traces 158 which add some interconnect resistance to their respective AMR resistors should be matched to provide essentially the same interconnect resistance to maintain the resistor balance of the AMR resistors inside the Wheatstone bridge.

A top ILD layer 145 can optionally be on the top metal layer 150 (see FIG. 3 described below). The top metal layer 150 can comprise aluminum or copper. There is generally 3 layers of metal interconnect, but there can be 2 layers of metal interconnect, or more than 3 layers of metal interconnect. The bond pads 181, 182 can be traditional bondpads comprising Al or Cu enabling wirebonding to.

In the case of the top metal layer 150 comprising aluminum which is highly reflective, the method 100 can further comprise forming refractory metal comprising pads (refractory metal pads) 152, such as titanium nitride (TiN) pads on the top metal layer 150 which acts as anti-reflective coating (ARC) layer to facilitate lithography. However, the refractory metal pads 152 may be removed, such as during the PO layer etch to open the bond pads 181 and 182 (see step 105 described below).

The functional circuitry 180 includes at least CMOS circuitry, as well as optionally Bipolar Junction Transistors (BJTs) and/or power devices as well. The integrated device can also include precision analog elements such as Thin Film Resistors (TFRs) and capacitors which can be placed in metal layers such as the M1 to M3 layers. The AMR resistors formed in step 102 described below will typically be in a dual-Wheatstone Bridge arrangement, with one AMR bridge at a 45 degree rotation with respect to the other AMR bridge. The functional circuitry can apply a voltage onto the Wheatstone Bridge or serve as a current source. The output of the Wheatstone Bridge measures a voltage and the output circuitry can include a low noise amplifier with low noise attributes to amplify a sensor output signal generally about 20 µV or less. In addition the two Wheatstone bridges can have some voltage offset as the AMR resistors are generally not perfectly matched. Two output amplifiers, one for each bridge, can sense this offset and correct the offset to high precision.

Step 102 comprises forming an AMR device 160 above the lower metal stack 130 lateral to the functional circuitry 180. An AMR stack is deposited beginning with a seed layer 161, then an AMR material layer 162, then a capping layer 163. Layers 161-163 can be deposited in one deposition system without breaking a vacuum. In another embodiment the seed layer 161 can be deposited in a first deposition tool and then be moved to a second deposition tool for depositing the AMR material layer 162 and the capping layer 163. In this other embodiment before AMR material layer 162 is deposited a pre-sputter etch can be used to etch the surface of the seed layer 161 to remove any oxide layer that may have formed.

The seed layer 161 provides a seed for the AMR material layer 162 such as NiFe to form a <111> crystal texture which yields the maximum magneto-resistance. The seed layer 161 is coupled to AMR contact pads 150a and 150b. FIG. 2 described below shows a coupling structure comprising metal filled AMR vias 153 that couple the seed layer 161 to the AMR contact pads 150a, 150b, while FIG. 3 described below shows a coupling structure of refractory metal pads 152 (e.g., TiN) as an ARC in the case the top metal layer 150 comprises aluminum for coupling the seed layer 161 to the AMR contact pads 150a, 150b. There may also be no coupling structure (the seed layer 161 being directly on the AMR contact pads 150a, 150b). The capping layer 163 can comprise a dielectric material, such as AN. The capping layer 163 can also comprise an electrically conductive material such as Ta, or TaN.

The material for the seed layer 161 should generally be as high a resistivity as possible, but there may be physical limits and the seed layer 161 will always conduct some amount of current. In one embodiment the seed layer 161 comprises a tantalum nitride (TaN) layer. The seed layer 161 can also comprise Ta, IrMn or Ti. As noted above a secondary purpose of the seed layer 161 is to be a seed for <111> texture growth of the NiFe as the AMR material layer 162 which provides a maximum magneto-resistance effect. Accordingly, a trade-off exists for the seed layer 161, being thick enough to form an AMR material layer 162 such as <111> NiFe, but thin enough not to conduct significant current. In the case of TaN more N increases the seed layer 161 resistance but if too high in N the TaN layer can become unstable and thus can delaminate or peel off. The thickness of seed layer 161 can be 50-300 A, such as 100 A of sputtered TaN which as described above can get sputter etched before depositing the AMR material layer 162 to a lower thickness value of around 60 A.

The AMR stack can be deposited directly on a portion of the top metal layer 150 or on refractory metal pads 152 that are on the top metal layer 150. In one particular embodiment the seed layer 161 comprises TaN, the AMR material layer 162 comprises NiFe, and the capping layer 163 comprises AN.

Step 103 comprises patterning the AMR stack. One embodiment is a single step patterning and etching for all layers of the stack. In another embodiment a mask is used to dry (or wet) etch the seed layer 161 first. This seed layer mask can be a bit larger (e.g., ≥0.1 µm) than the AMR material layer 162 mask (which also etches the capping layer 163) to provide a small (e.g., 0.2 µm) extension of the seed layer 161 out from the AMR material layer 162 (See FIG. 3 described below). The AMR material layer 162 and capping layer 163 can then be wet etched together, or dry etched together. This feature allows benefits such as making sure the metal filled AMR vias (e.g., tungsten (W) plugs) are not exposed to the AMR material layer 162 wet etch chemicals. The AMR stack can be formed in a serpentine pattern that is connected electrically in a Wheatstone bridge arrangement. There are various known ways of making a serpentine resistor.

Step 104 comprises depositing a PO layer 190 over the AMR stack. The PO layer comprises a dielectric layer such as silicon oxide, silicon nitride or SiON. The PO layer 190 is thus deposited after forming the patterned AMR stack and is directly on the capping layer 163 and the top surface of the top metal layer 150. Step 105 comprises etching openings 190a in the PO layer to reveal the bond pads 181, 182. This allows assembly wirebonding to the AMR device 160.

In one embodiment (see FIG. 2 described below), the providing step further includes a top ILD layer 145 on the top metal layer 150, and the method further comprises etching AMR vias in the top ILD layer 145 over the AMR contact pads 150a and 150b, and filling the AMR vias with a metal filler material (e.g., W) and planarizing (e.g., CMP) to form metal filled AMR vias 153 which contact the AMR contact pads 150a and 150b. In this embodiment the seed layer 161 is formed over the metal filled vias 153.

FIG. 2 is a cross-sectional view of an example integrated device 200 having metal filled vias 153 coupling the seed layer to the AMR contact pads 150a and 150b, according to an example embodiment. Here the AMR stack (e.g. AlN/NiFe/TaN) land on metal filled vias 153 which can comprises small W filled vias. An example standard via process comprises depositing a silicon oxide dielectric, etching via holes in the dielectric, sputtering tungsten (W) to fill the via holes, and Chemical Mechanical Polishing (CMP) back the W to form a planar oxide surface. The method to realize integrated device 200 only generally involves two masks added (AMR Via, and the AMR stack pattern). Although not shown, there can also optionally be dummy patterns of AMR stacks for improving resistance matching.

The AMR vias can be designed in various ways. In one arrangement the AMR vias can be standard vias (e.g., square shaped) that in the final device can form a 2D array of such vias which are contained entirely within the AMR material layer 162. The AMR vias can also be a rectangular vias that can be the same width as the standard via in the process (e.g., 0.28 µm), and can be long and extend the entire width of the AMR material layer 162, such as about 10 µm long. The rectangular AMR via can be a single long AMR via or be multiple long AMR vias. The rectangular AMR vias can be contained entirely within the AMR material layer 162, or can extend out past the edge of the AMR layer in the width direction.

FIG. 3 is a cross-sectional view of another example integrated device 300 having the seed layer directly on refractory metal pads 152 on the AMR contact pads 150a and 150b, according to an example embodiment. As noted, the seed layer 161 is shown extending out from the AMR material layer 162. In this embodiment the AMR stack (e.g. ALN/NiFe/TaN) lands on the AMR contact pads 150a and 150b directly (such as in the case of Cu top metal layer 150) or as shown on the refractory metal pads 152 shown on the AMR contact pads 150a and 150b (such as in the case of an Al top metal layer 150). The method to realize integrated device 300 only generally involves one mask added (AMR stack pattern).

Advantages of disclosed embodiments include:
1. Performance of an AMR sensor involves current to flow in the AMR material layer 162 (e.g., a NiFe layer). Any current that flows in the seed layer 161 (e.g., TaN) or other metal layers in parallel to the current flowing in the AMR material will degrade the AMR device performance. In disclosed architectures, there can be a single electrically conductive layer (the seed layer 161) underneath the AMR material layer 162, which can be thin, and a dielectric AN (capping layer 163) over the AMR material layer 162 such as NiFe. The capping layer 163 is only needed to act as a barrier to prevent the AMR material layer 162 from oxidizing.
2. There is generally no need to have any other routing layers (e.g. Al) processed after the AMR material layer 162 is deposited. This reduces the complexity of the process flow.
3. As described above, there is the option to extend the seed layer 161 beyond the outer edge of the AMR material layer 162. This can help to prevent undercut of the AMR stack.
4. The existing CMOS stack and it's interconnects can remains untouched so that the current flow from the AMR contact pads 150a and 150b to the functional circuitry 180 (e.g. CMOS circuitry) can bypass the AMR material layer 162. In known related art all metal pads have additional layers in them, such as Al—TiW—TaN—NiFe—TaN—Al for current to pass through to go from one metal layer to another.
5. By reducing the number of metal-metal interfaces it is expected that the sources of noise including Johnson noise and 1/f noise, will also be reduced as a consequence.

Disclosed embodiments can be used to form integrated device die having AMR devices that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this disclosure relates will appreciate that many other embodiments and variations of embodiments are possible within the scope of the claimed invention, and further additions, deletions, substitutions and modifications may be made to the described embodiments without departing from the scope of this disclosure.

The invention claimed is:

1. A method of forming an integrated device, comprising:
 providing a substrate having a semiconductor surface layer including functional circuitry, a lower metal stack on said semiconductor surface layer, an interlevel dielectric (ILD) layer on said lower metal stack, a top metal layer providing AMR contact pads and bond pads coupled to said AMR contact pads in said ILD layer;
 forming an anisotropic magnetoresistive (AMR) device above said lower metal stack lateral to said functional circuitry including depositing an AMR stack including a seed layer, an AMR material layer then a capping layer including a dielectric material, the dielectric material including AlN, wherein said seed layer is coupled between said AMR material layer and said AMR contact pads;
 patterning said AMR stack;
 depositing a protective overcoat (PO layer) over said AMR stack, and
 etching openings in said PO layer to reveal said bond pads.

2. The method of claim 1, wherein said PO layer comprises silicon oxide, silicon nitride or SiON.

3. The method of claim 1, wherein said providing further includes a top ILD layer on said top metal layer, further comprising etching AMR vias in said top ILD layer over said AMR contact pads, filling said AMR vias with a metal filler material and planarizing to form metal filled AMR vias which contact said AMR contact pads, wherein said seed layer is formed over said metal filled AMR vias.

4. The method of claim 3, wherein said metal filler material comprises tungsten (W).

5. The method of claim 1, wherein said top metal layer comprises aluminum, further comprising forming refractory metal comprising pads (refractory metal pads) on said top metal layer.

6. The method of claim 5, wherein said depositing said AMR stack comprises depositing said AMR stack directly on a portion of said refractory metal pads.

7. The method of claim 1, wherein said substrate comprises silicon and said seed layer comprises TaN having more N than stoichiometric TaN, and said AMR material layer comprises NiFe.

8. The method of claim 1, wherein said patterning said AMR stack comprises using a mask to dry etch said seed layer to be larger than a size of said AMR material layer to provide an extension of said seed layer out from said AMR material layer.

9. An integrated device, comprising:
 a substrate having a semiconductor surface layer including functional circuitry, a lower metal stack on said semiconductor surface layer, an interlevel dielectric (ILD) layer on said lower metal stack, a top metal layer providing AMR contact pads and bond pads coupled to said AMR contact pads in said ILD layer;

an anisotropic magnetoresistive (AMR) device above said lower metal stack lateral to said functional circuitry comprising a patterned AMR stack including a seed layer, an AMR material layer, and a capping layer including a dielectric material, the dielectric material including AlN, wherein said seed layer is coupled between said AMR material layer and said AMR contact pads;

a protective overcoat (PO layer) over said AMR stack, and openings in said PO layer revealing said bond pads.

10. The integrated device of claim 9, wherein said PO layer comprises silicon oxide, silicon nitride or SiON.

11. The integrated device of claim 9, further comprising a top ILD layer on said top metal layer and metal filled AMR vias which contact said AMR contact pads, wherein said seed layer is formed over said metal filled AMR vias.

12. The integrated device of claim 9, wherein a metal filler of said metal filled AMR vias comprises tungsten (W).

13. The integrated device of claim 9, wherein said top metal layer comprises aluminum, further comprising refractory metal comprising pads (refractory metal pads) on said top metal layer.

14. The integrated device of claim 13, wherein said AMR stack is directly on a portion of said refractory metal pads.

15. The integrated device of claim 9, wherein said substrate comprises silicon, said seed layer comprises TaN having more N than stoichiometric TaN, and said AMR material layer comprises NiFe.

16. The integrated device of claim 9, wherein said seed layer extends beyond said AMR material layer by at least 0.1 µm.

* * * * *